United States Patent
Puggelli et al.

(10) Patent No.: US 10,833,579 B1
(45) Date of Patent: Nov. 10, 2020

(54) SWITCHED CAPACITOR REGULATORS WITH FLYING-INVERTER-CONTROLLED POWER SWITCHES

(71) Applicant: Lion Semiconductor Inc., San Francisco, CA (US)

(72) Inventors: Alberto Alessandro Angelo Puggelli, Burlingame, CA (US); Zhipeng Li, Fremont, CA (US); Thomas Li, Mountain View, CA (US)

(73) Assignee: Lion Semiconductor Inc., San Francisco, CA (US)

( * ) Notice: Subject to any disclaimer, the term of this patent is extended or adjusted under 35 U.S.C. 154(b) by 0 days.

(21) Appl. No.: 15/801,054

(22) Filed: Nov. 1, 2017

Related U.S. Application Data

(60) Provisional application No. 62/415,836, filed on Nov. 1, 2016.

(51) Int. Cl.
*H02M 3/07* (2006.01)
*G06F 1/28* (2006.01)
*H02J 7/00* (2006.01)
*H03K 19/0948* (2006.01)
*G11C 5/14* (2006.01)

(52) U.S. Cl.
CPC .............. *H02M 3/07* (2013.01); *G06F 1/28* (2013.01); *H02J 7/00* (2013.01); *G11C 5/145* (2013.01); *H02J 2207/20* (2020.01); *H03K 19/0948* (2013.01)

(58) Field of Classification Search
CPC .. H02M 3/07; H02J 7/0052; H02J 2007/0059; G06F 1/28
See application file for complete search history.

(56) References Cited

U.S. PATENT DOCUMENTS

| 5,973,944 A * | 10/1999 | Nork ................. H02M 1/44 307/110 |
| 2009/0072800 A1* | 3/2009 | Ramadass ............. H02M 3/07 323/271 |

(Continued)

OTHER PUBLICATIONS

Kim et al., "A Fully-Integrated 3-Level DC-DC Converter for Nanosecond-Scale DVFS", in IEEE Journal of Solid-State Circuits, vol. 47, No. 1, Jan. 2012, pp. 1-14.

(Continued)

*Primary Examiner* — Thienvu V Tran
*Assistant Examiner* — Bart Iliya
(74) *Attorney, Agent, or Firm* — Byrne Poh LLP

(57) ABSTRACT

A switching capacitor regulator, comprising: a switching capacitor configured to switch between a first state and a second state, wherein, in the first state, a first node of the switching capacitor is coupled to a second terminal, and a second node of the switching capacitor is coupled to a fixed voltage level, and wherein, in the second state, the first node is coupled to a first terminal, and the second node is coupled to the second terminal; a power switch configured to couple the second node to the second terminal when the switching capacitor is in the second state; and a flying inverter configured to control the power switch, wherein the flying inverter has a positive power terminal and a negative power terminal, wherein the positive power terminal is coupled to the first node, and wherein the negative power terminal is coupled to the second node.

7 Claims, 7 Drawing Sheets

(56) References Cited

U.S. PATENT DOCUMENTS

| | | | |
|---|---|---|---|
| 2015/0022169 A1* | 1/2015 | Cannankurichi Vijaya Mohan .... | H02M 3/07 323/282 |
| 2015/0311794 A1* | 10/2015 | Khayat ................. | H02M 3/158 323/271 |
| 2016/0094214 A1* | 3/2016 | Liu ........................ | H02M 3/07 327/113 |
| 2016/0315539 A1* | 10/2016 | Lee ....................... | H02M 3/158 |
| 2016/0352218 A1* | 12/2016 | Stauth .................... | H02M 1/08 |
| 2018/0019669 A1* | 1/2018 | Zhang ................... | H02M 3/073 |
| 2018/0069472 A1* | 3/2018 | Wei ........................ | H02M 3/07 |

OTHER PUBLICATIONS

Kim et al., "System Level Analysis of Fast, Per-Core DVFS Using On-Chip Switching Regulators", in IEEE International Symposium of High-Performance Computer Architecture (HPCA), Feb. 2008, pp. 1-12.

Le et al., "Design Techniques for Fully Integrated Switched-Capacitor DC-DC Converters", in IEEE Journal of Solid-State Circuits, vol. 46, No. 9, Sep. 2011, pp. 2120-2131.

\* cited by examiner

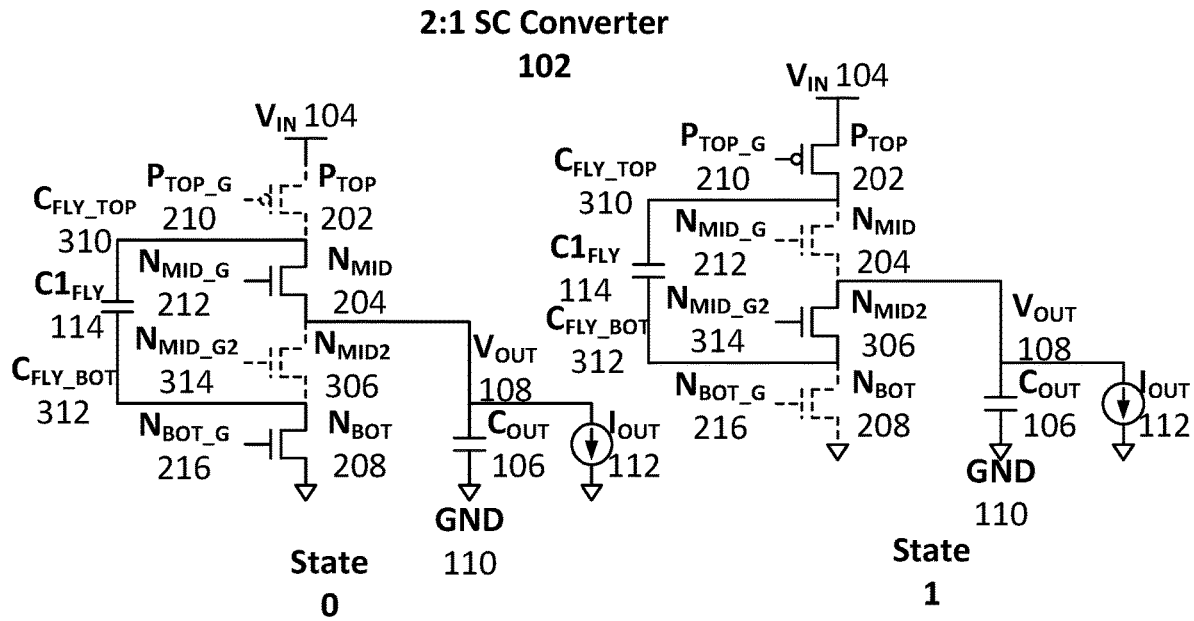
FIG. 3A
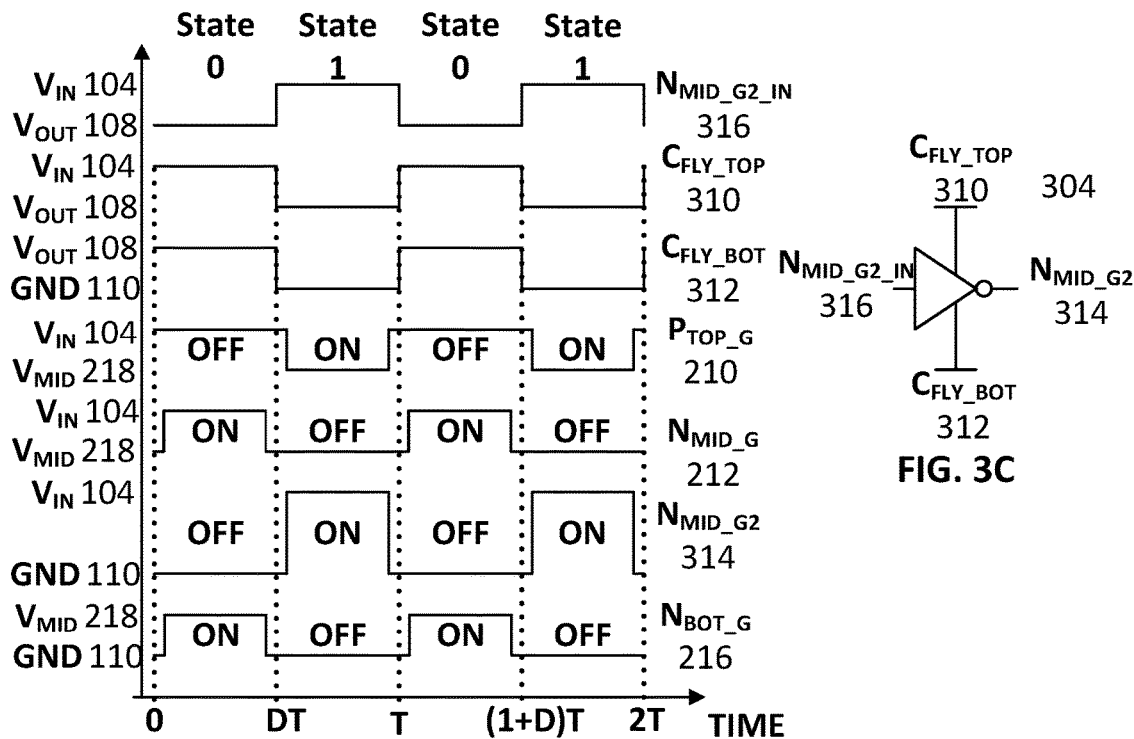
FIG. 3B
FIG. 3C

SWITCHED CAPACITOR REGULATORS WITH FLYING-INVERTER-CONTROLLED POWER SWITCHES

CROSS REFERENCE TO RELATED APPLICATION

This application claims the benefit of U.S. Provisional Patent Application No. 62/415,836, filed Nov. 1, 2016, which is hereby incorporated by reference herein in its entirety.

TECHNICAL FIELD

The present disclosure relates to a switched capacitor (SC) regulator. The SC regulator may use a negative channel metal-oxide semiconductor (NMOS) power field-effect transistor (FET) and a flying inverter.

BACKGROUND

Many modern electronic systems have been tightly integrated as a system-on-chip (SoC) that incorporates multiple processing cores and heterogeneous components (e.g., memory controllers, hardware accelerators) within a single chip. The popularity of SoCs, coupled with tighter power budgets, motivates controlling the voltage and frequency at a block-specific granularity. The block-specific voltage control can allow the electronic system to raise only the voltage of the computing blocks (e.g., processor cores) that desires higher performance. Such a block-specific voltage control can improve power and/or performance.

However, traditional approaches of dynamic voltage and frequency scaling (DVFS) have been performed at a coarse-grain level due to cost and size limitations of off-chip voltage regulators. Moreover, traditional DVFS schemes were limited to a slow voltage/frequency scaling at the micro-second timescale due to the slow speed of off-chip voltage regulators. Faster DVFS in the nanosecond timescale can save significantly more power consumed by the SoC by closely tracking the SoC voltage to the rapidly changing computation demand.

Given the drawback of off-chip voltage regulators, there has been a surge of interest in building integrated voltage regulators (IVR)—a voltage regulator that is integrated with other components (e.g., processor cores) in a single chip or in a single package—to reduce board size and to enable nanosecond timescale, per-core DVFS.

An IVR can include a variety of voltage regulators, including a switching regulator and a low-dropout linear regulator. IVRs that can reduce the board size and can enable nanosecond timescale, per-core DVFS are disclosed in "System Level Analysis of Fast, Per-Core DVFS using On-Chip Switching Regulators," published in IEEE International Symposium on High-Performance Computer Architecture (HPCA) in February 2008, by Wonyoung Kim et al.; an article entitled "Design Techniques for Fully Integrated Switched-Capacitor DC-DC Regulators," published in IEEE Journal of Solid-State Circuits (JSSC) in September 2011, by Hanh-Phuc Le et al.; and an article entitled "A Fully-Integrated 3-Level DC/DC Regulator for Nanosecond-Scale DVFS," published in IEEE Journal of Solid-State Circuits (JSSC) in January 2012, by Wonyoung Kim et al., each of which is hereby incorporated by reference herein in its entirety.

A switching regulator can include a switching capacitor (SC) regulator. A switching capacitor regulator can use one or more capacitors, instead of inductors, to transfer charge from a power source to an output load. The switching capacitor regulator can control the output voltage by changing the configuration and the sequence in which capacitors are connected to one another.

Unfortunately, efficiencies of switching capacitor regulators can degrade at output voltages that are not a predetermined fraction of the input voltage. For example, a switching capacitor regulator can achieve high efficiencies at ½, ⅓, ⅔, ⅖, ⅗ of the input voltage. However, the same switching capacitor regulator can fail to provide high efficiencies when the output voltage deviates from those values. This is a problem for many SoCs that operate within a continuous range of voltages, or a range of voltages in 5-10 mV steps.

SUMMARY

In accordance with some embodiments, switching capacitor regulators with flying-inverter controlled power switches are provided. In some embodiments, switching capacitor regulators are provided, the switching capacitor regulators comprising: a first terminal; a second terminal; a switching capacitor configured to switch between a first state and a second state, wherein, in the first state, a first node of the switching capacitor is coupled to the second terminal, and a second node of the switching capacitor is coupled to a fixed voltage level, and wherein, in the second state, the first node of the switching capacitor is coupled to the first terminal, and the second node of the switching capacitor is coupled to the second terminal; a power switch configured to couple the second node of the switching capacitor to the second terminal when the switching capacitor is in the second state; and a flying inverter configured to control the power switch, wherein the flying inverter has a positive power terminal and a negative power terminal, wherein the positive power terminal is coupled to the first node of the switching capacitor, and wherein the negative power terminal is coupled to the second node of the switching capacitor.

In some embodiments of these switching capacitor regulators the first terminal is configured as an input terminal, the second terminal is configured as an output terminal, and an output voltage produced at the output terminal is smaller than an input voltage received at the input terminal.

In some embodiments of these switching capacitor regulators the first terminal is configured as an output terminal, the second terminal is configured as an input terminal, and an output voltage produced at the output terminal is larger than an input voltage received at the input terminal.

In some embodiments of these switching capacitor regulators the switching capacitor regulator can be configured to operate in each of (i) a step-up mode wherein a voltage produced by the switching capacitor regulator is larger than a voltage received by the switching capacitor regulator and (ii) a step-down mode wherein a voltage produced by the switching capacitor regulator is smaller than a voltage received by the switching capacitor regulator.

In some embodiments of these switching capacitor regulators the power switch is a field effect transistor having a gate, and wherein the output of the flying inverter is coupled to the gate.

In some embodiments of these switching capacitor regulators the power switch is a negative channel metal-oxide semiconductor (NMOS) power switch.

In some embodiments of these switching capacitor regulators the switching capacitor regulator is configured to operate in a time-interleaved manner with a second switching capacitor regulator over a time period.

In some embodiments of these switching capacitor regulators the second terminal is coupled to a battery.

BRIEF DESCRIPTION OF THE DRAWINGS

Various objects, features, and advantages of the disclosed subject matter can be more fully appreciated with reference to the following detailed description of the disclosed subject matter when considered in connection with the following drawings, in which like reference numerals identify like elements.

FIG. 3A shows an example of a switch matrix of a 2:1 SC regulator in accordance with some embodiments.

FIG. 3B shows example waveforms for power switches of the SC regulator of FIG. 3A in accordance with some embodiments.

FIG. 3C shows an example of a flying inverter configured for use in connection with the regulator of FIG. 3A in accordance with some embodiments.

DETAILED DESCRIPTION

In the following description, numerous specific details are set forth regarding the systems and methods of the disclosed subject matter and the environment in which such systems and methods may operate, etc., in order to provide a thorough understanding of the disclosed subject matter. It will be apparent to one skilled in the art, however, that the disclosed subject matter may be practiced without such specific details, and that certain features, which are well known in the art, are not described in detail in order to avoid complication of the disclosed subject matter. In addition, it will be understood that the examples provided below are for illustration purposes only, and that it is contemplated that there are other systems and methods that are within the scope of the disclosed subject matter.

Figure 1A:
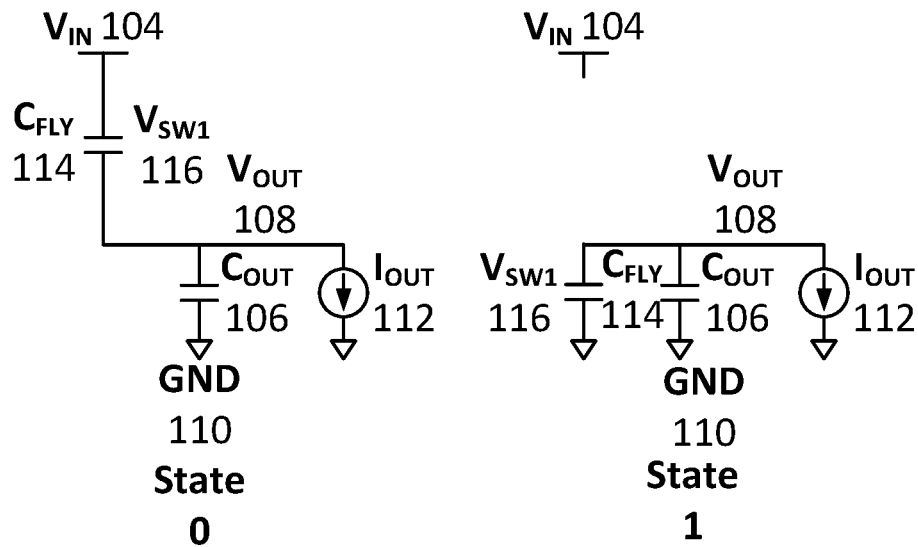
FIG. 1A shows an example of an SC regulator.

FIG. 1A illustrates a switching capacitor regulator 102. Switching capacitor regulator 102 can include a plurality of capacitors $C_{FLY}$ 114 and $C_{OUT}$ 106, and a switch matrix (not shown in the figure for simplicity). A switch matrix can include a plurality of switches. Switching capacitor regulator 102 can achieve high efficiency when the output voltage $V_{OUT}$ 108 is close to a fraction of an input voltage $V_{IN}$ 104.

In this particular example, the fraction is ½, although the fraction can be any other suitable fraction.

$C_{FLY}$ 114 is a switching capacitor, and can be connected in different ways depending on how the switch matrix is connected and disconnected. $C_{OUT}$ 106 is a decoupling capacitor, and is always coupled to the output $V_{OUT}$ 108 to reduce noise on the output. The decoupling capacitor $C_{OUT}$ 106 can be a large capacitor that reduces the noise or ripple of the output voltage $V_{OUT}$ 108.

Figure 1B:
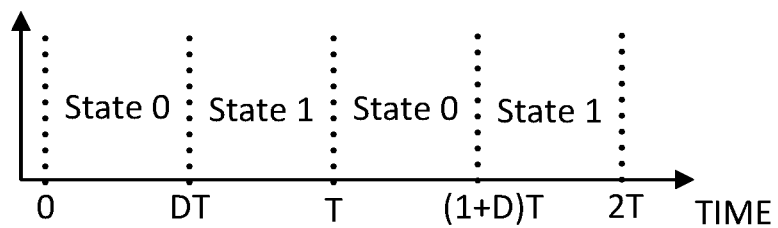
FIG. 1B shows an example of a timing diagram of the SC regulator of FIG. 1A.

Depending on the configuration of the switch matrix, the switching capacitor regulator can be in State 0 or State 1. The switches can turn on and off periodically (e.g., at a certain frequency) so that the switching capacitor $C_{FLY}$ 114 alternates between State 0 and State 1 periodically as well. As illustrated in FIG. 1A, in state 0, a first node of $C_{FLY}$ 114 can be connected to $V_{IN}$ 104, and a second node of $C_{FLY}$ 114 can be connected to a first node of $C_{OUT}$ 106 and an output terminal of output $V_{OUT}$ 108. In state 1, the second node of $C_{FLY}$ 114 can be connected to ground, and the first node of $C_{FLY}$ 114 can be connected to the first node of $C_{OUT}$ 106 and an output terminal of output $V_{OUT}$ 108. In both state 1 and state 0, a second node of $C_{OUT}$ 106 can be connected to ground 110. As shown in FIG. 1B, the regulator can spend time 0 through time D*T in State 0 and time D*T through time T in State 1, where D is a duty cycle number between 0 and 1.

In State 1, the voltage $V_{SW1}$ 116 across the switch capacitor switching capacitor $C_{FLY}$ 114 is equal to the output voltage $V_{OUT}$ 108. Assuming that the switching capacitor $C_{FLY}$ 114 is large enough, the voltage $V_{SW1}$ 116 can stay roughly the same in both States 0 and 1. Therefore, when the capacitor configuration changes to State 0, the relationship between $V_{IN}$ 102 and $V_{OUT}$ 104 can be computed as $V_{IN}=2\times V_{SW1}=2\times V_{OUT}$. Therefore, the output voltage $V_{OUT}$ 108 can be set to ½ of $V_{IN}$ 104 in this example. Switching capacitor regulator 102 may be referred to as a 2:1 step-down switching capacitor regulator. The output load that consumes the current 112 can be any type of an electronic device, including processors, memory (e.g., DRAM, NAND flash), RF chips, WiFi combo chips, and power amplifiers, for example.

The fractional value of the input voltage $V_{IN}$ 104 at which the switching capacitor regulator 102 achieves high efficiency can be determined by the number of stacked capacitors between the input node and the ground during State 0. For example, in FIG. 1A, the number of stacked capacitors between the input node (e.g., the node at which the input voltage $V_{IN}$ 104 is provided) and the ground node is 2. Therefore, the switching capacitor regulator achieves a high efficiency when its output voltage is ½ of the input voltage $V_{IN}$ 104. When the number of stacked capacitors between the input node and the ground node is increased to N, the switching capacitor regulator can achieve a high efficiency when its output voltage is 1/N of the input voltage $V_{IN}$ 104.

Figure 2A:
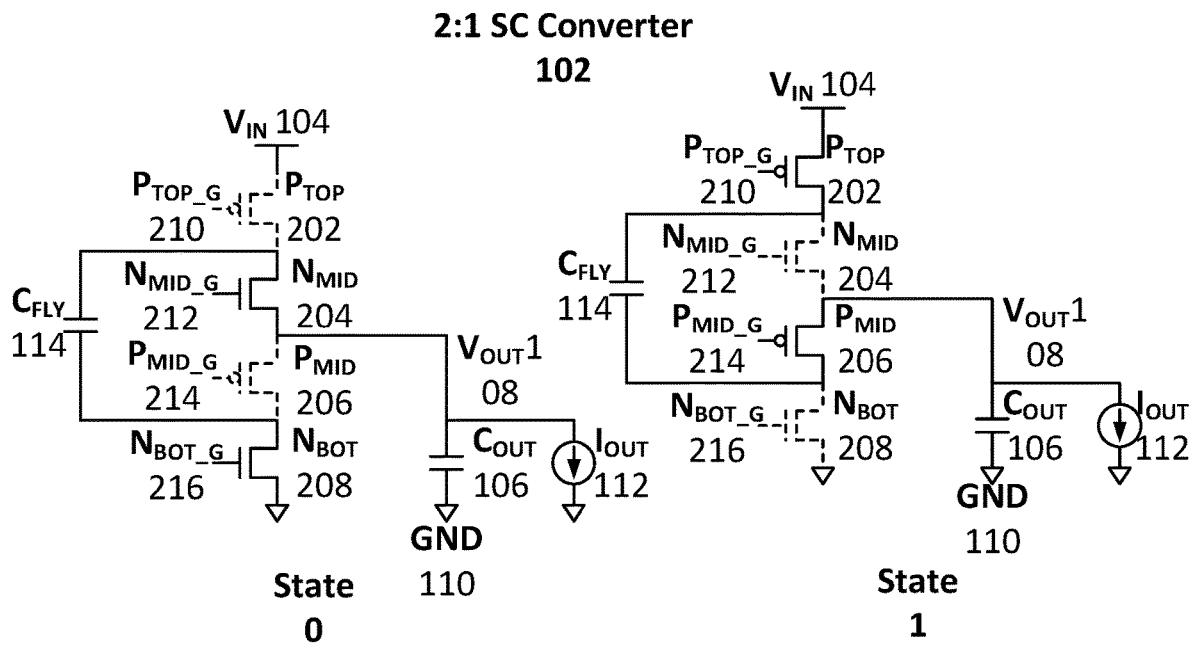
FIG. 2A shows an example of a switch matrix of an SC regulator.

FIG. 2A illustrates an example of a switch matrix of SC regulator 102, where a positive channel metal-oxide semiconductor (PMOS) power switch $P_{MID}$ 206 is used. The switch matrix may include four power switches ($P_{TOP}$ 202, $N_{MID}$ 204, $P_{MID}$ 206, and $N_{BOT}$ 208) that turn on and off between State 0 and State 1 to regulate $V_{OUT}$ 108 to be close to ½ of $V_{IN}$ 104. $P_{TOP}$ 202 and $P_{MID}$ 206 can be PMOS FET power switches, while $N_{MID}$ 204 and $N_{BOT}$ 208 can be NMOS FET power switches. The switch matrix may be controlled by four gate signals ($P_{TOP\_G}$ 210, $N_{MID\_G}$ 212, $P_{MID\_G}$ 214, and $N_{BOT\_G}$ 216) of the four power switches $P_{TOP}$ 202, $N_{MID}$ 204, $P_{MID}$ 206, and $N_{BOT}$ 208. The gate signals drive a respective gate of $P_{TOP}$ 202, $N_{MID}$ 204, $P_{MID}$ 206, and $N_{BOT}$ 208 to turn them on or off.

As shown in FIG. 2A, in state 0, $P_{TOP}$ 202 and $P_{MID}$ 206 are turned off as indicated by dashed lines. In state 1, $P_{TOP}$ 202 and $P_{MID}$ 206 are turned on, while $N_{MID}$ 204 and $N_{BOT}$ 208 are turned off as indicated by dashed lines. As illustrated in FIG. 2A, in state 1, a first node of $C_{FLY}$ 114 can be connected to $V_{IN}$ 104, and a second node of $C_{FLY}$ 114 can be connected to a first node of decoupling capacitor $C_{OUT}$ 106 and an output terminal that outputs $V_{OUT}$ 108. In state 0, the first node of $C_{FLY}$ 114 can be connected to the first node of decoupling capacitor $C_{OUT}$ 106 and the output terminal that outputs $V_{OUT}$ 108, and the second node of $C_{FLY}$ 114 can be connected to ground. In both state 1 and state 0, a second node of $C_{OUT}$ 106 can be connected to ground 110.

Figure 2B:
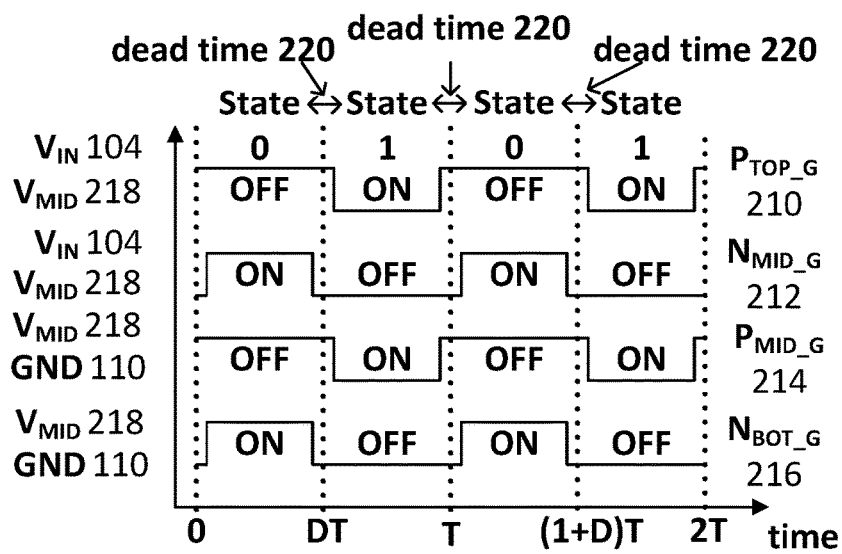
FIG. 2B shows example waveforms for power switches of the SC regulator of FIG. 2A.

FIG. 2B illustrates example waveforms for the four gates ($P_{TOP\_G}$ 210, $N_{MID\_G}$ 212, $P_{MID\_G}$ 214, and $N_{BOT\_G}$ 216) of the four power switches $P_{TOP}$ 202, $N_{MID}$ 204, $P_{MID}$ 206, and $N_{BOT}$ 208. $V_{MID}$ 218 can be connected to $V_{OUT}$ 108 or can be supplied by a separate voltage regulator that generates a voltage close to ½ of the input voltage $V_{IN}$ 104.

As illustrated in FIG. 2B, $P_{TOP\_G}$ 210 and $N_{MID\_G}$ 212 can share the same signal, and $P_{MID\_G}$ 214 and $N_{BOT\_G}$ 216 can share the same signal. There can be a dead time 220 between the turn off time of $P_{TOP\_G}$ 210 and turn on time of $N_{MID\_G}$ 212 to avoid a case where both switches are turned on at the same time, which can lead to malfunction of the SC regulator. The gate drive signals can be shared among power switches.

In some embodiments, an SC regulator can use an NMOS power switch. The NMOS switch may be used instead of a PMOS power switch by using a "flying" buffer (or inverter), for example. Using an NMOS power switch instead of a PMOS power switch can reduce power consumption and may increase efficiency of an SC regulator. NMOS power switches can have ½ to ⅓ resistance of PMOS power switches, leading to ½ to ⅓ of parasitic resistive loss, or ½ to ⅓ the size (chip area) for similar resistive loss. Parasitic capacitive loss, or switching loss, also can decrease to ½ to ⅓ when switch size is smaller.

FIG. 3A illustrates a 2:1 SC regulator 302 that uses an NMOS power switch $N_{MID2}$ 306 rather than $P_{MID}$ 206 in accordance with some embodiments. The switch matrix may include four power switches ($P_{TOP}$ 202, $N_{MID}$ 204, $N_{MID2}$ 306, and $N_{BOT}$ 208) that turn on and off between State 0 and State 1 to regulate $V_{OUT}$ 108 to be close to ½ of $V_{IN}$ 104. $P_{TOP}$ 202 can be a PMOS FET power switch, while $N_{MID}$ 204, $N_{MID2}$ 306, and $N_{BOT}$ 208 can be NMOS FET power switches. The switch matrix may be controlled by four gate signals ($P_{TOP\_G}$ 210, $N_{MID\_G}$ 212, $N_{MID\_G2}$ 314, and $N_{BOT\_G}$ 216) of the four power switches $P_{TOP}$ 202, $N_{MID}$ 204, $N_{MID2}$ 306, and $N_{BOT}$ 208. The gate signals drive a respective gate of $P_{TOP}$ 202, $N_{MID}$ 204, $N_{MID2}$ 306, and $N_{BOT}$ 208 to turn them on or off.

As shown in FIG. 3A, in state 0, $P_{TOP}$ 202 and $N_{MID2}$ 306 are turned off as indicated by dashed lines. In state 1, $P_{TOP}$ 202 and $N_{MID2}$ 306 are turned on, while $N_{MID}$ 204 and $N_{BOT}$ 208 are turned off as indicated by dashed lines. As illustrated in FIG. 3A, in state 1, a first node of $C_{FLY}$ 114 can be connected to $V_{IN}$ 104, and a second node of $C_{FLY}$ 114 can be connected to a first node of decoupling capacitor $C_{OUT}$ 106 and an output terminal that outputs $V_{OUT}$ 108. In state 0, the first node of $C_{FLY}$ 114 can be connected to the first node of decoupling capacitor $C_{OUT}$ 106 and the output terminal that outputs $V_{OUT}$ 108, and the second node of $C_{FLY}$ 114 can be connected to ground. In both state 1 and state 0, a second node of $C_{OUT}$ 106 can be connected to ground 110.

FIG. 3B illustrates that the gate driving signal $N_{MID\_G2}$ 314 for $N_{MID2}$ 306 needs to swing between GND 110 and $V_{IN}$ 104, so it can no longer share drivers with other power switches. To turn on $N_{MID2}$ 306 in state 1, its gate voltage needs to be larger than its source and drain voltages, which is close to $V_{OUT}$ 108. Therefore, the converter can set $N_{MID\_G2}$ 314 to be similar to $V_{IN}$ 104 in state 1 to fully turn on $N_{MID2}$ 306. To turn off $N_{MID2}$ 306 in state 0, its gate needs to be similar to or smaller than its source and drain voltage, which is close to GND 110 and $V_{OUT}$ 108, respectively. Therefore, the converter can set $N_{MID\_G2}$ 314 to be similar to GND 110 in state 0 to fully turn off $N_{MID2}$ 306.

One way to generate the signal for $N_{MID\_G2}$ 314 that swings between GND 110 and $V_{IN}$ 104 is to use a chain of buffers or inverters with input and output voltage swinging between GND 110 and $V_{IN}$ 104. These buffers can include transistors with voltage rating of $V_{IN}$ 104. A voltage rating of a transistor can indicate the maximum gate-source, source-drain, drain-gate voltage that can be applied to a transistor. These buffers with high voltage ratings may have drawbacks, however. First, transistors with high voltage ratings can be bulkier than those with low voltage ratings, making the buffers bulky. Second, there can be more switching loss in the chain of buffers or inverters that use high voltage rated transistors. Switching loss equals $CV^2f$, where C is parasitic capacitance, V is voltage swing, and f is frequency. The parasitic gate capacitance of high voltage rated transistors are higher than low voltage rated transistors, so C is higher. If the voltage swing is higher, V is higher, so switching loss is higher. To reduce switching loss, a buffer that uses transistors with lower voltage rating than $V_{IN}$ 104, with a smaller voltage swing on the input, is advantageous.

FIG. 3C illustrates a flying inverter 304 that enables using transistors with $V_{IN}/2$ voltage rating, and an input voltage swing of $V_{IN}/2$. Each of these values is half of the respective values discussed above, and can reduce switching loss to ⅛ (e.g., because V is half and C is half). The purpose of a flying inverter 304 is therefore to generate the signal for $N_{MID\_G2}$ 314 when lower voltage rated transistors and an input voltage swing of $V_{IN}/2$ are used. This is a flying inverter since the supply and ground of the inverter 304 are not fixed to a DC value, but are tied to $C_{FLY\_TOP}$ 310 and $C_{FLY\_BOT}$ 312. The flying inverter 301 can use transistors with $V_{IN}/2$ voltage rating because the voltage difference between $C_{FLY\_TOP}$ 310, $C_{FLY\_BOT}$ 312, $N_{MID\_G2\_IN}$ 316, and $N_{MID\_G2}$ 314 are $V_{IN}-V_{OUT}$ or $V_{OUT}$ 108. In a 2:1 SC regulator 302, $V_{OUT}$ 108 can be close to half of $V_{IN}$ 104, so the voltage rating of the flying inverter can be roughly half of $V_{IN}$ 104, allowing it to use lower voltage rated switches that incur less loss. Moreover, since the voltage swing of $N_{MID\_G2\_IN}$ 316 is $V_{OUT}$ 108 to $V_{IN}$ 104, switching loss of the buffers is smaller compared to when the voltage swing is between GND 110 and $V_{IN}$ 104. The flying inverter can be a series of inverters, or buffers.

An SC regulator can operate in multi-phase. The multi-phase SC regulator can include a plurality of parallel SC regulators that operate in a time-interleaved manner over a time period T. For example, a 3-phase SC regulator can include three sets of switches and inductors that each operate 0 degrees, 120 degrees, 240 degrees out of phase over a time period.

In some embodiments, 2:1 SC regulator 102 and/or 302 can be operated as a battery charger. For example, an input node of the regulator can be coupled to a power source, e.g., a power line of a Universal Serial Bus (USB), and an output node of the regulator can be coupled to a battery so that the output voltage and the output current of the regulator are used to charge the battery.

In some embodiments, the above-identified configuration, in which a battery is charged using a USB power line, can be used in reverse as a USB On-The-Go (OTG), where the battery in a first device can deliver power to a second device over USB to charge the second device. In this scenario, a battery in a first device is configured to deliver current to a battery in a second device through a USB. Although the output voltage of the battery in the first device may be lower than the USB power line voltage, the regulator can operate in a step-up configuration to step-up the output voltage of the battery to that of the USB power line. This way, the battery in the first device can charge the battery in the second device over the USB power line.

Figure 5A:
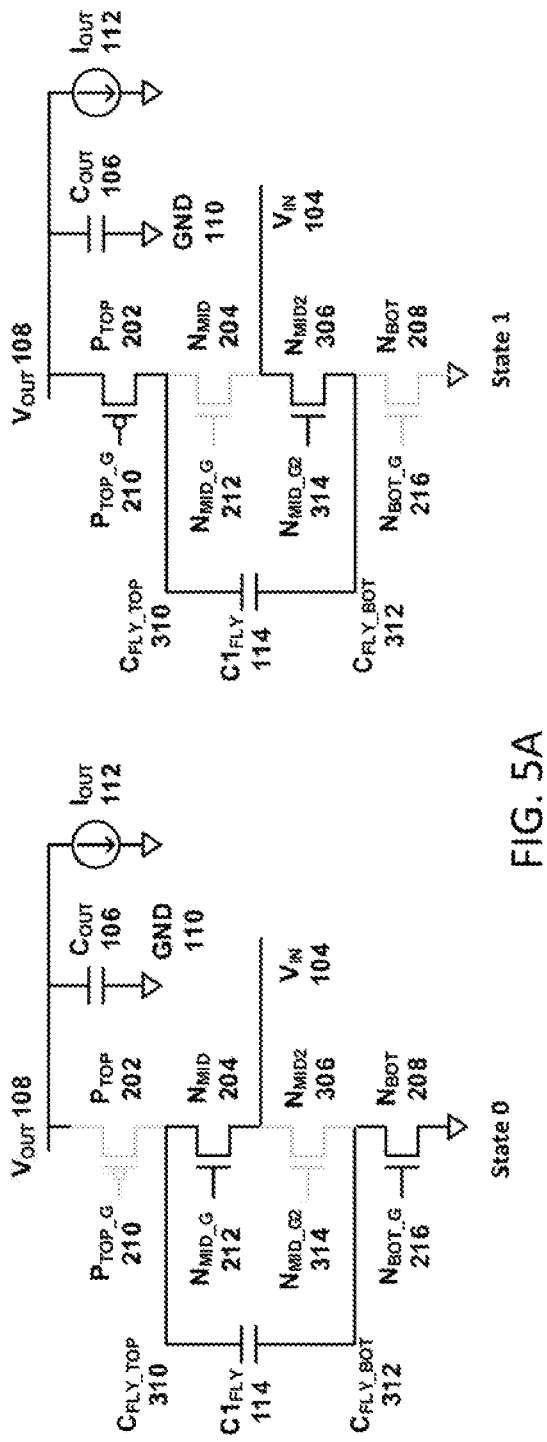
FIG. 5A shows an example of a switch matrix of a 2:1 SC regulator configured to operate in step-up mode in accordance with some embodiments.
Figure 5C:
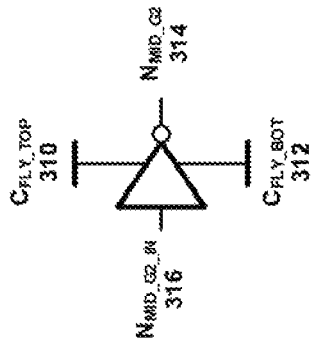
FIG. 5C shows an example of a flying inverter configured for use in connection with the regulator of FIG. 5A in accordance with some embodiments.
Figure 5B:
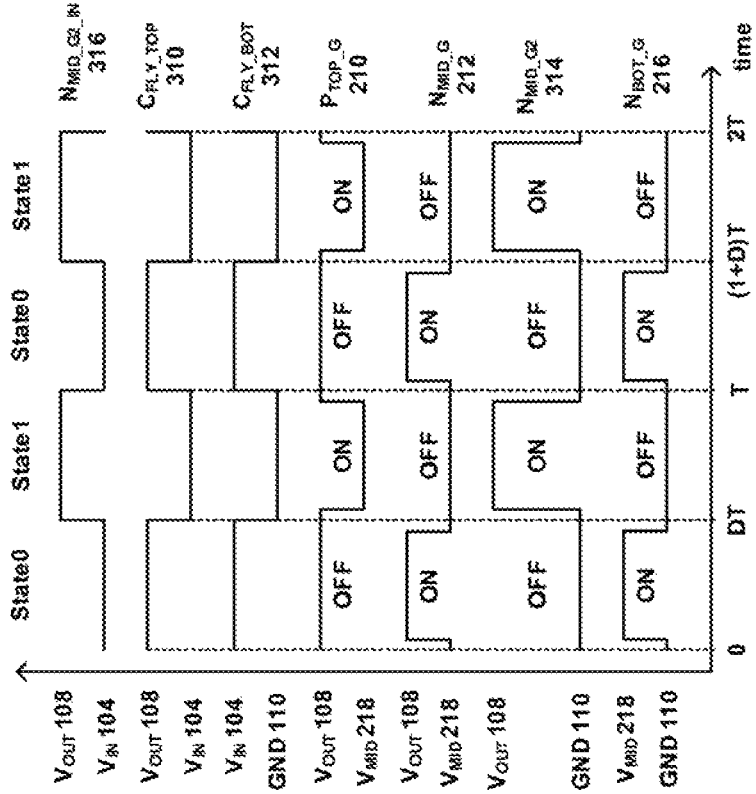
FIG. 5B shows example waveforms for power switches of the SC regulator of FIG. 5A in accordance with some embodiments.

Turning to FIGS. 5A-5C, an example of the regulator of FIGS. 3A-3C is shown in a step-up configuration. Similarly to the regulators of FIGS. 3A-3C, the regulator of FIG. 5A can be operated in accordance with the timing diagram shown in FIG. 5B and utilize the flying inverter of FIG. 5C to provide signal $N_{MID\_G2}$ 314 to switch $N_{MID2}$ 306 of FIG. 5A.

Figure 6:
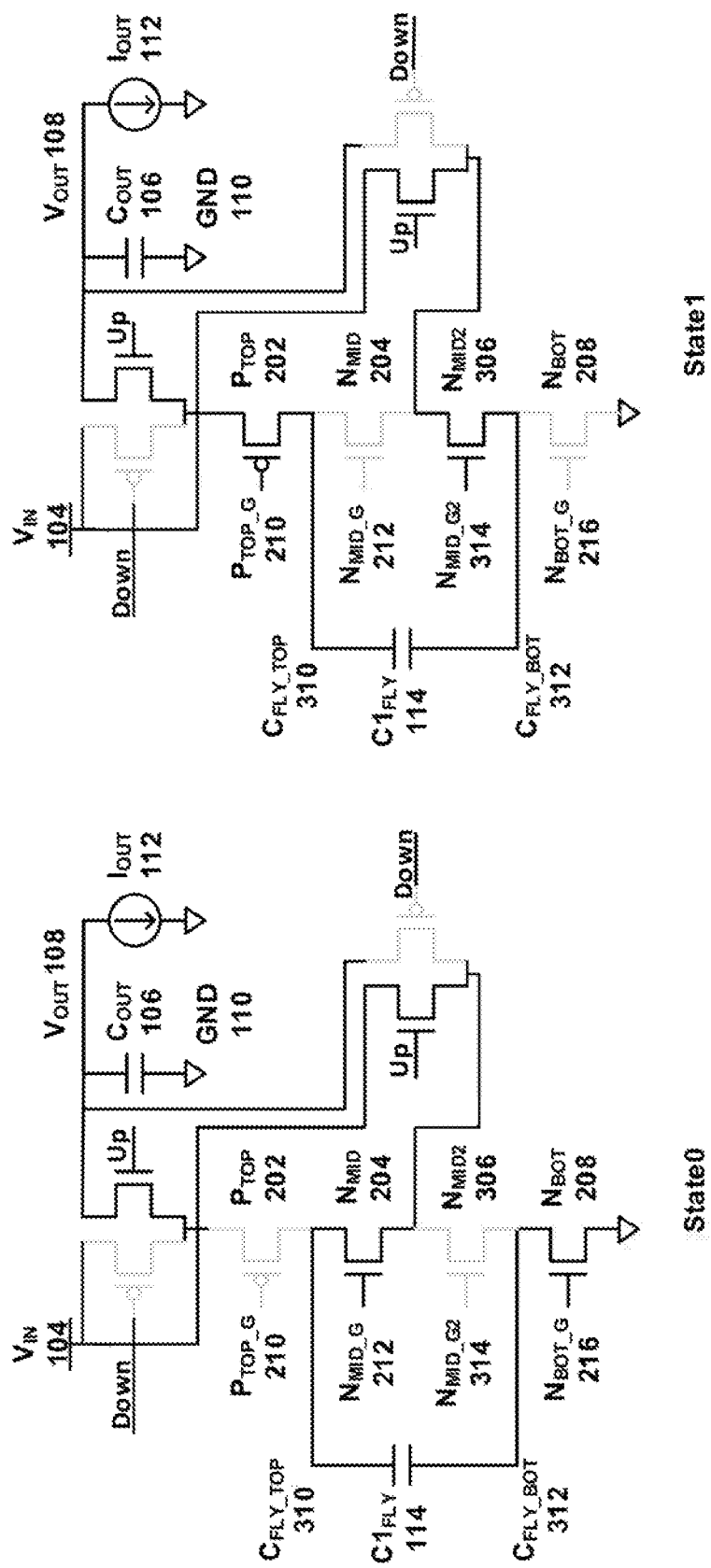
FIG. 6 shows an example of a switch matrix of a 2:1 SC regulator in accordance with some embodiments.

FIG. 6 illustrates an example of a regulator like the regulator illustrated in FIGS. 3A and 5A that can be operated in either the step-up or the step-down mode. FIG. 6 specifically shows its regulator in the step-up mode due to the switches having their gates connected to signal "Up" turned on and the switches having their gates connected to signal "Down" turned off. While in the step-up mode, the circuit of FIG. 6 can be operated according to the timing diagram of FIG. 5B. In order to operate the regulator of FIG. 6 in the step-down mode, the switches having their gates connected to signal "Down" can be turn on and the switches having their gates connected to signal "Up" can be turned off. While in the step-down mode, the circuit of FIG. 6 can be operated according to the timing diagram of FIG. 3B.

Figure 4:
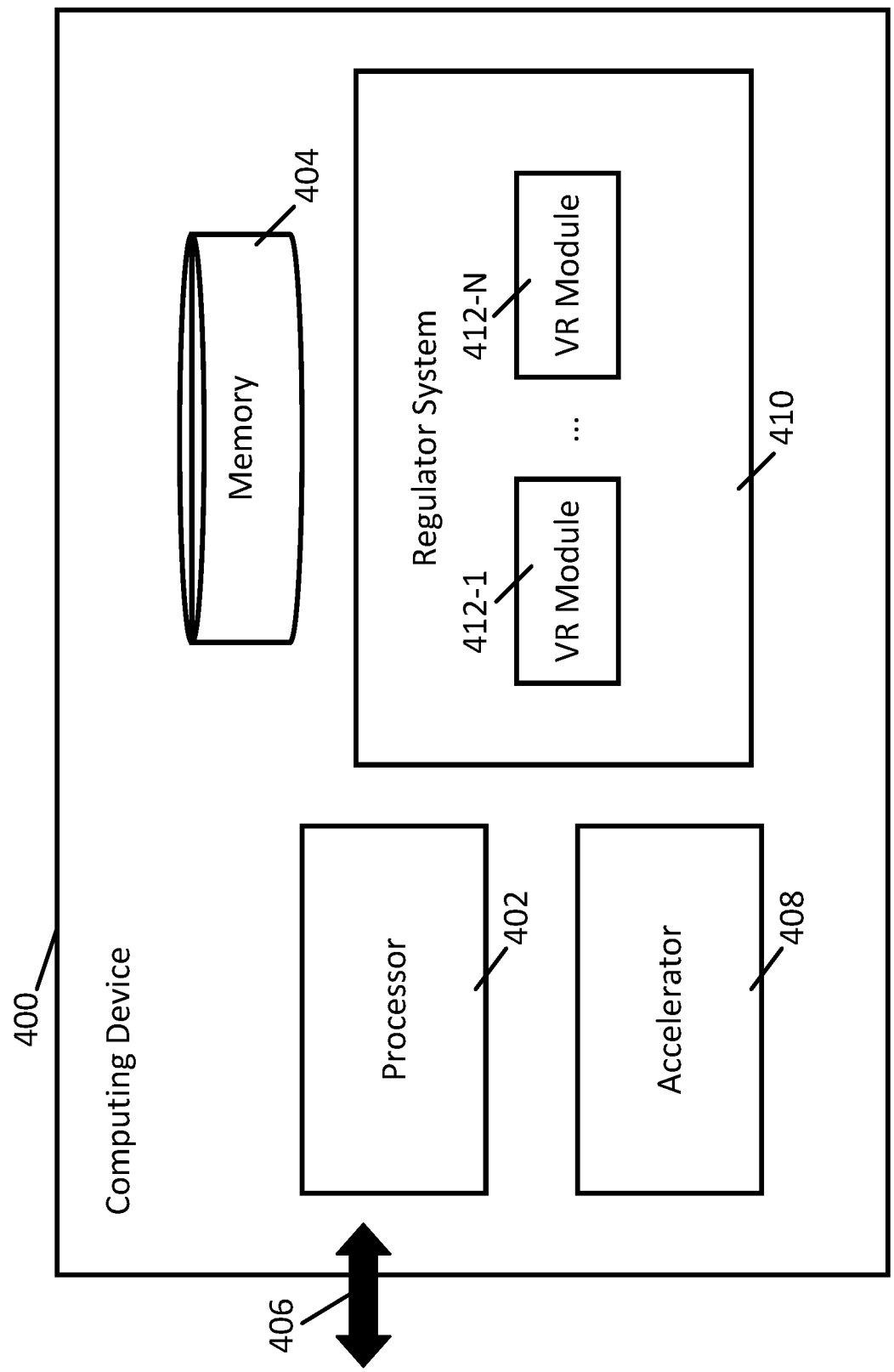
FIG. 4 shows an example of a block diagram of a computing device that includes an SC regulator in accordance with some embodiments.

FIG. 4 is a block diagram computing device that includes a switching capacitor regulator in accordance with some embodiments. The computing device 400 includes a processor 402, memory 404, one or more interfaces 406, an accelerator 408, and a regulator system 410. The computing device 400 may include additional modules, fewer modules, or any other suitable combination of modules that perform any suitable operation or combination of operations.

In some embodiments, the accelerator 408 can be implemented in hardware using an application specific integrated circuit (ASIC). The accelerator 408 can be a part of a system on chip (SOC). In other embodiments, the accelerator 408 can be implemented in hardware using a logic circuit, a programmable logic array (PLA), a digital signal processor (DSP), a field programmable gate array (FPGA), or any other integrated circuit. In some cases, the accelerator 408 can be packaged in the same package as other integrated circuits.

In some embodiments, the regulator system 410 can be configured to provide a supply voltage to one or more of the processor 402, memory 404, and/or an accelerator 408. The regulator system 410 can include one or more voltage regulator (VR) modules 412-1 . . . 412-N. In some embodiments, one or more of the VR modules 412-1 . . . 412-N can be SC regulator 102 and/or 302, for example, as disclosed in FIGS. 1*a*, 2*a*, and 3*a*. In some embodiments, the one or more VR modules 412-1 . . . 412-N may operate in multiple interleaved phases.

In some embodiments, the voltage regulator system 410 can include a switch control module that is configured to control the switch configuration in one or more VR modules 412-1 . . . 412-N. For example, when the switch control module receives an instruction to operate an SC regulator 302, the switch control module can be configured to control the switch matrix to operate the SC regulator 302 in a 2:1 conversion mode. As another example, when the switch control module receives an instruction to operate the SC regulator 302 in a different conversion mode, the switch control module can be configured to control the switch matrix to operate the SC regulator in the different conversion mode. In some embodiments, the switch control module can be synthesized using hardware programming languages. The hardware programming languages can include Verilog, VHDL, Bluespec, or any other suitable hardware programming language. In other embodiments, the switch control module can be manually designed and can be manually laid-out on a chip.

The computing device 400 can communicate with other computing devices (not shown) via the interface 406. The interface 406 can be implemented in hardware to send and receive signals in a variety of mediums, such as optical, copper, and wireless, and in a number of different protocols, some of which may be non-transient.

In some embodiments, the computing device 400 can include user equipment. The user equipment can communicate with one or more radio access networks and with wired communication networks. The user equipment can be a cellular phone having telephonic communication capabilities. The user equipment can also be a smart phone providing services such as word processing, web browsing, gaming, e-book capabilities, an operating system, and a full keyboard. The user equipment can also be a tablet computer providing network access and most of the services provided by a smart phone. The user equipment operates using an operating system such as Symbian OS, iPhone OS, RIM's Blackberry, Windows Mobile, Linux, HP WebOS, Tizen, Android, or any other suitable operating system. The screen might be a touch screen that is used to input data to the mobile device, in which case the screen can be used instead of the full keyboard. The user equipment can also keep global positioning coordinates, profile information, or other location information. The user equipment can also be a wearable electronic device.

The computing device 400 can also include any platforms capable of computations and communication. Non-limiting examples include televisions (TVs), video projectors, set-top boxes or set-top units, digital video recorders (DVR), computers, netbooks, laptops, and any other audio/visual equipment with computation capabilities. The computing device 400 can be configured with one or more processors that process instructions and run software that may be stored in memory. The processor also communicates with the memory and interfaces to communicate with other devices. The processor can be any applicable processor such as a system-on-a-chip that combines a CPU, an application processor, and flash memory. The computing device 400 can also provide a variety of user interfaces such as a keyboard, a touch screen, a trackball, a touch pad, and/or a mouse. The computing device 400 may also include speakers and a display device in some embodiments. The computing device 400 can also include a bio-medical electronic device.

It is to be understood that the disclosed subject matter is not limited in its application to the details of construction and to the arrangements of the components set forth in the following description or illustrated in the drawings. The disclosed subject matter is capable of other embodiments and of being practiced and carried out in various ways. Also, it is to be understood that the phraseology and terminology employed herein are for the purpose of description and should not be regarded as limiting.

As such, those skilled in the art will appreciate that the conception, upon which this disclosure is based, may readily be utilized as a basis for the designing of other structures, apparatuses, systems, and methods for carrying out the several purposes of the disclosed subject matter. It is important, therefore, that the subject matter be regarded as including such equivalent constructions insofar as they do not depart from the spirit and scope of the disclosed subject matter.

Although the invention has been described and illustrated in the foregoing illustrative embodiments, it is understood that the present disclosure has been made only by way of example, and that numerous changes in the details of implementation of the invention can be made without departing from the spirit and scope of the invention, which is limited only by the claims that follow. Features of the disclosed embodiments can be combined and rearranged in various ways.

What is claimed is:

1. A switching capacitor regulator, comprising:
   a first terminal;
   a second terminal;
   a switching capacitor configured to switch between a first state and a second state, wherein, in the first state, a first node of the switching capacitor is coupled to the second terminal, and a second node of the switching capacitor is coupled to a fixed voltage level, and wherein, in the second state, the first node of the switching capacitor is coupled to the first terminal, and the second node of the switching capacitor is coupled to the second terminal;
   a first power switch configured to couple the second node of the switching capacitor to the second terminal when the switching capacitor is in the second state, wherein the first power switch is a negative channel metal-oxide semiconductor (NMOS) power switch;
   a second power switch configured to couple the first node of the switching capacitor to the second terminal when the switching capacitor is in the first state, wherein the second power switch is controlled by a signal that switches between a first pair of voltage levels, and wherein the second power switch is a negative channel metal-oxide semiconductor (NMOS) power switch; and
   a flying inverter configured to control the first power switch, wherein the flying inverter has a positive power terminal and a negative power terminal, wherein the positive power terminal always has the same voltage as the first node of the switching capacitor, wherein the negative power terminal always has the same voltage as the second node of the switching capacitor, and wherein the flying inverter controls the first power switch using a signal that switches between a second pair of voltage levels that is different from the first pair of voltage levels.

2. The switching capacitor regulator of claim 1, wherein the first terminal is configured as an input terminal, the second terminal is configured as an output terminal, and an output voltage produced at the output terminal is smaller than an input voltage received at the input terminal.

3. The switching capacitor regulator of claim 1, wherein the first terminal is configured as an output terminal, the second terminal is configured as an input terminal, and an output voltage produced at the output terminal is larger than an input voltage received at the input terminal.

4. The switching capacitor regulator of claim 1, wherein the switching capacitor regulator can be configured to operate in each of (i) a step-up mode wherein a voltage produced by the switching capacitor regulator is larger than a voltage received by the switching capacitor regulator and (ii) a step-down mode wherein a voltage produced by the switching capacitor regulator is smaller than a voltage received by the switching capacitor regulator.

5. The switching capacitor regulator of claim 1, wherein the first power switch is a field effect transistor having a gate, and wherein the output of the flying inverter is coupled to the gate.

6. The switching capacitor regulator of claim 1, wherein the switching capacitor regulator is configured to operate in a time-interleaved manner with a second switching capacitor regulator over a time period.

7. The switching capacitor regulator of claim 1, wherein the second terminal is coupled to a battery.

* * * * *